US 6,570,172 B2

(12) United States Patent
Kim et al.

(10) Patent No.: US 6,570,172 B2
(45) Date of Patent: *May 27, 2003

(54) MAGNETRON NEGATIVE ION SPUTTER SOURCE

(75) Inventors: Steven Kim, Harrington Park, NJ (US); Minho Sohn, Newton, MA (US)

(73) Assignee: Plasmion Corporation, Hoboken, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/568,665

(22) Filed: May 11, 2000

(65) Prior Publication Data

US 2002/0070357 A1 Jun. 13, 2002

Related U.S. Application Data

(60) Provisional application No. 60/133,702, filed on May 12, 1999.

(51) Int. Cl.[7] .......................... H01J 27/02; H01J 27/00
(52) U.S. Cl. .................... 250/493.1; 250/492.3
(58) Field of Search ............... 250/493.1, 283, 250/423 R, 424, 426, 423 P, 423 F, 492.21, 492.3

(56) References Cited

U.S. PATENT DOCUMENTS

| 4,377,773 A | * | 3/1983 | Hershcovitch et al. .. 315/111.81 |
| 4,661,710 A | | 4/1987 | Verney et al. .............. 250/423 |
| 5,047,394 A | * | 9/1991 | Wolfe et al. .................... 505/1 |
| 5,466,941 A | | 11/1995 | Kim ........................... 250/423 |
| 5,521,389 A | | 5/1996 | Kim ........................... 250/423 |
| 5,581,156 A | * | 12/1996 | Roberts et al. ......... 315/111.81 |
| 5,780,862 A | * | 7/1998 | Siess ....................... 250/492.3 |

* cited by examiner

Primary Examiner—John R. Lee
Assistant Examiner—Anthony G. Quash
(74) Attorney, Agent, or Firm—Morgan, Lewis Bockius LLP

(57) ABSTRACT

A negative ion source is disclosed which includes an electrode, a target having a more negative electrical potential than the electrode, a supply of electrical energy for generating a discharge between the electrode and the target, and at least one magnet positioned so as to confine electrons, generated as a result of said discharge, in close proximity to a first surface of the target. The negative ion source further includes a delivery system for delivering cesium to a second surface of the target, and a distribution chamber interposed between the delivery system and the target for uniformly distributing cesium on the second surface of said target. The cesium diffuses through openings in the target from the first surface to the second surface. The negative ion source may comprise a conventional magnetron sputter source that has been retrofitted to include a cesium distribution system.

11 Claims, 8 Drawing Sheets

MAGNETRON NEGATIVE ION SPUTTER SOURCE

This application claims the benefit of Provisional application Ser. No. 60/133,702 filed May 12, 1999.

FIELD OF THE INVENTION

The invention relates to ion beam sources, and more particularly, to a negative ion beam source that evidences a large area having either a circular or rectangular geometry.

BACKGROUND OF THE INVENTION

The prior art includes a number of procedures for depositing thin films of materials on both conductive and non-conductive substrates. Ion beam deposition is beneficial for many types of coating techniques. For deposition of diamond-like carbon coatings, chemical vapor deposition and vapor phase deposition techniques are predominant. Chemical vapor deposition procedures include hot filament emission systems, plasma assisted deposition systems, plasma jet and DC arc jet systems. Each of the deposition-procedures requires that the substrate have a high temperature. The processes further employ a gas mixture with a large percentage of hydrogen. High concentrations of hydrogen often result in polymer-like hydrocarbon impurities in the films and require an addition of gases like oxygen to burn off the polymer. Vapor phase deposition procedures include carbon arc systems, sputtering and laser ablation systems. While such systems maintain the temperature of the substrate relatively low, substantial effort is required to control the properties of deposited films. Further, scale-up of vapor phase deposition processes to enable continuous deposition, requires substantial investment.

Ion beam deposition has many benefits when compared with chemical vapor deposition. Ion beam deposition procedures enable room temperature deposition. The deposition rate of metal negative ions is not effected by temperature. Little or no sample surface preparation is required and the procedure employs no hydrogen in the ion beam atmosphere. The deposition rate from a focused negative ion beam can be as great as 100 microns per hour. In general, vapor phase prior art deposition procedures have not enabled metal ions to be deposited over large deposition areas.

Ion beam deposition systems employing a plasma or gas discharge to sputter an electrode, generating an ion beam for film deposition, are widely used. Sputtering is a phenomenon where, when an electrical discharge occurs between two electrodes in a low gas pressure environment, molecules of the gas are ionized, and material from the more negative electrode (−), or target, is slowly disintegrated by the bombardment of the ionized gas molecules. The material is disintegrated from the target in the form of free atoms, or in chemical combination with the residual gas molecules. Some of the liberated atoms may be condensed on surfaces surrounding the target while the remainder may be returned to the target by collision with gas molecules.

Reference in this regard may be had to Vacuum Deposition of Thin Films, L. Holland (Chapman and Hall, London, 1966).

This process is also referred to as cathodic sputtering and may be compared to a fine sand blasting in which the momentum of the bombarding particles is more important than their energy. Argon is typically utilized as the sputtering gas because it is inert, plentiful, a heavy gas and has a low ionization potential. The inert nature of argon inhibits compounds from being formed on the target surface.

Once disintegrated, or sputtered, from the target, the atoms travel until they reach a nearby surface, for example, a substrate. The deposited layer forms or grows on the substrate structure and is influenced by such things as material, temperature and gas structure.

When the ions strike the target, they gain back their lost electron, their primary electrical charge is then neutralized, and they return to the process as atoms. Direct current sources generally prevail as the electrical energy source. If the target is an insulator, the neutralization process results in a positive charge on the target surface. This charge may grow to the point that the bombarding ions (+) are repelled and the sputtering process stops. In order to make the process continue, the polarity of the target must be reversed to attract enough electrons from the discharge to eliminate the surface charge. In order to attract the electrons and not repel the ions, the frequency must be high enough to reverse the polarity before the direction of the ions are affected. A typical industrial frequency for such purposes is 13.56 Mhz. Since this is a radio frequency, this process is commonly referred to as RF sputtering. RF sputtering makes it possible to sputter insulators. FIG. 1 shows an example of how ions are generated and deposition occurs as a result of RF sputtering.

It is known to utilize magnetic fields for concentrating the electrical discharge. In a configuration referred to as a planar magnetron configuration, a magnetic field is imposed in such a way that the electrons generated by the ionization process are trapped in a region near the target surface. These electrons are held much closer together than in the case of a non magnetic configuration and are forced to move in a path within the magnetic field. If the magnetic path is closed, then the electrons will circulate freely around the enclosed magnetic field. The magnetic field lines are typically circular, causing the electron path to also be circular. Because the electrons are concentrated within this region, a gas atom entering this electron cloud has a greater probability of losing an electron and thus becoming ionized. This increased efficiency means that a lower gas pressure is required to maintain the sputtering process. This so called magnetron action only occurs when the magnetic field and the electric field are normal, that is, at 90° to one another. Therefore, the majority of the ionization occurs in the center of the electron cloud. The ions thus formed are instantly attracted to the negatively biased target where, as described above, they collide with its surface, causing atoms of material from its surface to be ejected (sputtered). An example of the operation of a planar magnetron sputtering configuration is shown in FIG. 2.

In the planar magnetron configuration, the rate of removal of material from the target may be approximately ten times faster than in the case of non magnetic configurations. Because the electrons are confined by the magnetic field, and are not allowed to move about freely, very few of them reach the substrate, which is normally at ground potential. This eliminates much of the substrate heating experienced when the electrodes are not so confined. The target, on the other hand, comes under fierce ion bombardment, particularly in the area where most of the ions are produced, causing a very localized heating of the target material in the area defined by the magnetic field.

The sputtering systems described thus far utilize ion bombardment to sputter neutral particles, that is, atoms, from an electrode. The neutral particles travel until they are deposited on nearby surfaces. It is also known to bombard a target with a first ion beam in such a manner so as to cause a sputtering of oppositely charges ions from an electrode, causing the production of a second ion beam, whose ions are then deposited on the substrate. It has been determined that the use of cesium ions as the bombarding first ion source produces a high yield of oppositely charged ions from metal and refractory metal targets. This is because a cesium coating on the sputtering surface lowers the work function required to sputter negative ions from the target material. Other materials with a low electron affinity, such as rubidium or potassium, will also lower the work function, however, cesium, having the lowest electron affinity of any non radio-active element, is the most efficient in this regard.

Solid state cesium sources have been developed for ion beam deposition systems. Kim and Seidl describe a solid source of Cs+ ions in "Cesium Ion Transport Across A Solid Electrolyte-Porous Tungsten Interface", Journal of Vacuum Science Technology A7(3), May/June 1989, pages 1806–1809, and "A New Solid State Cesium Ion Source", General Applied Physics 67(6), Mar. 15, 1990, pages 2704–2710. The Cs+-source solid electrolyte comprises a cesium-mordenite solid electrode which is sandwiched between a porous tungsten emitting electrode and a nonporous platinum electrode. A combination of an applied voltage and heat enables Cs+ ions to be emitted. Further details of the solid electrolyte cesium source can be found in "The Theory of Metal-Solid Electrolyte Interface", Materials Research Society Symposium Proceedings, vol. 135, pages 95–100 and in U.S. Pat. No. 4,783,595, issued Nov. 8, 1998, entitled "Solid-state source if Ions and Atoms," by M. Seidl.

The Kim et al. cesium ion source, in ion gun form, has been used for ion beam sputter deposition of gold, copper, molybdenum, tungsten and tantalum. The cesium particles from the solid-state cesium ion gun pass through a pair of deflecting plates which cause the cesium ion beam to be directed towards a target that lies to one side of the center line of the ion gun, and not in its direct path. A substrate positioned opposite the target, and on the other side of the center line of the ion gun, receives the sputtered molecules that are liberated from the target as a result of the cesium bombardment. (See "Solid-State Cesium Ion Gun for Ion Beam Sputter Deposition" Kim et al., Review of Scientific Instruments, vol. 63 (no.12), December 1992, pages 5671–5673). Reference in this regard may also be had to U.S. Pat. No. 5,521,389, issued May 28, 1996, entitled "Solid State Cesium Ion Gun," by S. I. Kim and also to U.S. Pat. No. 5,466,941, issued Nov. 14, 1995, entitled "Negative Ion Sputtering Beam Source," by S. I. Kim. The disclosures of these two issued patents are incorporated by reference in their entirety insofar as they do not conflict with the teachings of the present invention.

Pargellis et al. in "Sputtering Negative Carbon Ions From Cesiated Graphite Surfaces" Journal of Vacuum Science Technology A1(3), July/September 1983, pages 1388–1393, describe a system for sputtering of negative carbon ions from graphite targets that are bombarded with cesium ions. Pargellis et al. bombarded a graphite block from a source of cesium atoms piped into the ion beam generation region from a cesium oven. The bombardment of the graphite target by the positive cesium ions causes generation of negative carbon ions. Few details are given regarding the specific arrangement of the cesium ovens and the various ion beam extraction electrodes.

Several kinds of sputtering type negative-ion sources that have been developed for negative ion deposition are described in an article by J. Ishikawa, entitled *"Negative-Ion Sources for Modification of Materials,"* Rev. of Scientific Instruments, 67 (Mar. 30, 1966).

In summary, and as was made evident above, ion beam deposition has many benefits when compared with chemical vapor deposition. Ion beam deposition procedures enable room temperature deposition. The deposition rate of metal negative ions is not effected by temperature. Little or no sample surface preparation is required and the procedure employs no hydrogen in the ion beam atmosphere. The deposition rate from a focused negative ion beam can be as great as 100 microns per hour. In general, vapor phase prior art deposition procedures have not enabled metal ions to be deposited over large deposition areas.

It is not known to utilize a conventional magnetron sputtering configuration to perform ion beam deposition. Such a configuration is advantageous in that the benefits of the magnetron configuration, that is, elimination of much of the substrate heating, and increased ion bombardment of the target can be combined with the benefits mentioned above of ion beam deposition.

OBJECTS AND ADVANTAGES OF THE INVENTION

It is an object and advantage of this invention to provide an improved magnetron sputter source for ion beam deposition. It is a second object and advantage of this invention to provide an improved magnetron sputter source which includes a cesium introduction capability to sputter negative ions. It is a further object and advantage of this invention to provide a uniform distribution of cesium on a surface of a sputtering target. It is a further object and advantage of this invention to allow cesium to diffuse through openings in the target to an area where sputtering of the target occurs. It is a further object and advantage of the invention to provide an improved magnetron sputter source having a circular or a non circular geometry.

SUMMARY OF THE INVENTION

The foregoing and other problems are overcome and the objects of the invention are realized by methods and apparatus in accordance with embodiments of this invention.

A negative ion source is disclosed which includes an electrode, a target having a more negative electrical potential than the electrode, a supply of electrical energy for generating a discharge between the electrode and the target, and at least one magnet positioned so as to confine electrons, generated as a result of said discharge, in close proximity to a first surface of the target. The negative ion source further includes a delivery system for delivering cesium to a second surface of the target, and a distribution chamber interposed between the delivery system and the target, for uniformly distributing cesium on the second surface of said target. The cesium diffuses through openings in the target from the first surface to the second surface. The negative ion source may comprise a conventional magnetron sputter source that has been retrofitted to include a cesium distribution system.

BRIEF DESCRIPTION OF THE DRAWINGS

The features and advantages of present invention will become more evident from the detailed description below in conjunction with FIGS. 1 through 7.

DETAILED DESCRIPTION OF THE PREFERRED EMBODIMENTS

Figure 1:
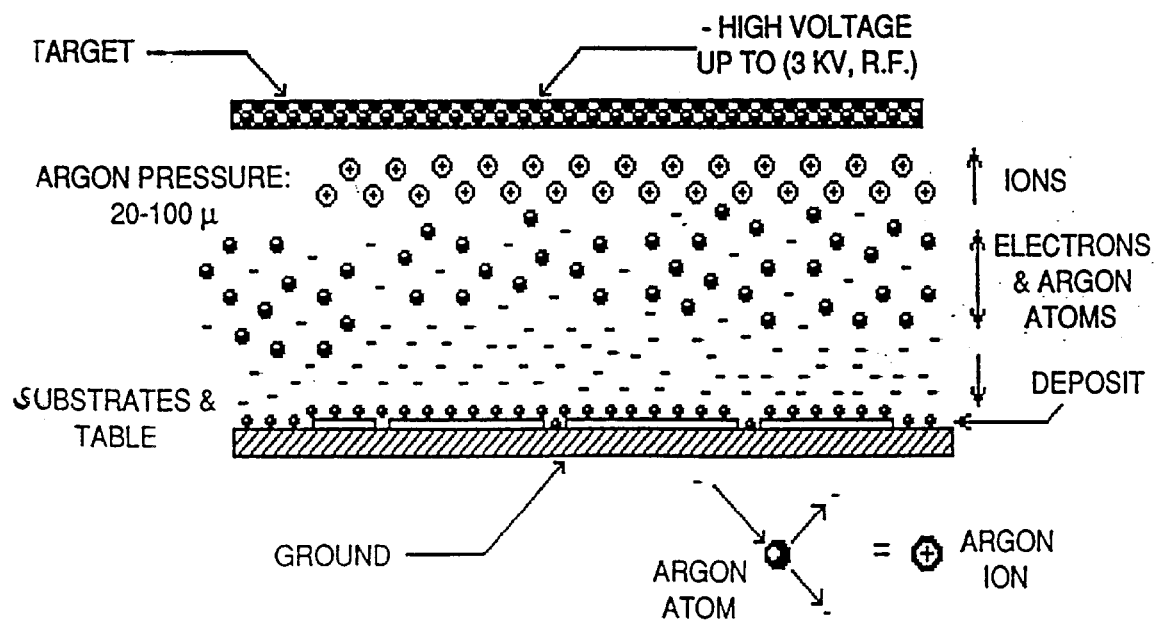
FIG. 1 shows the known mechanisms of ion generation and deposition using RF sputtering.
Figure 2:
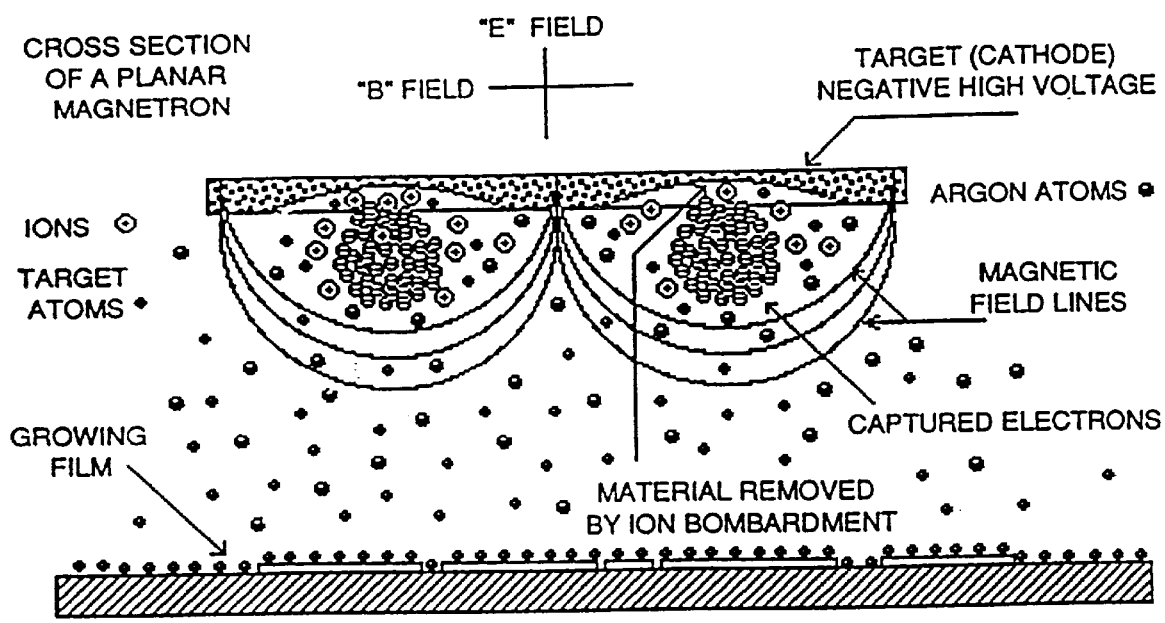
FIG. 2 shows a conventional planar magnetron sputtering configuration.
Figure 3:
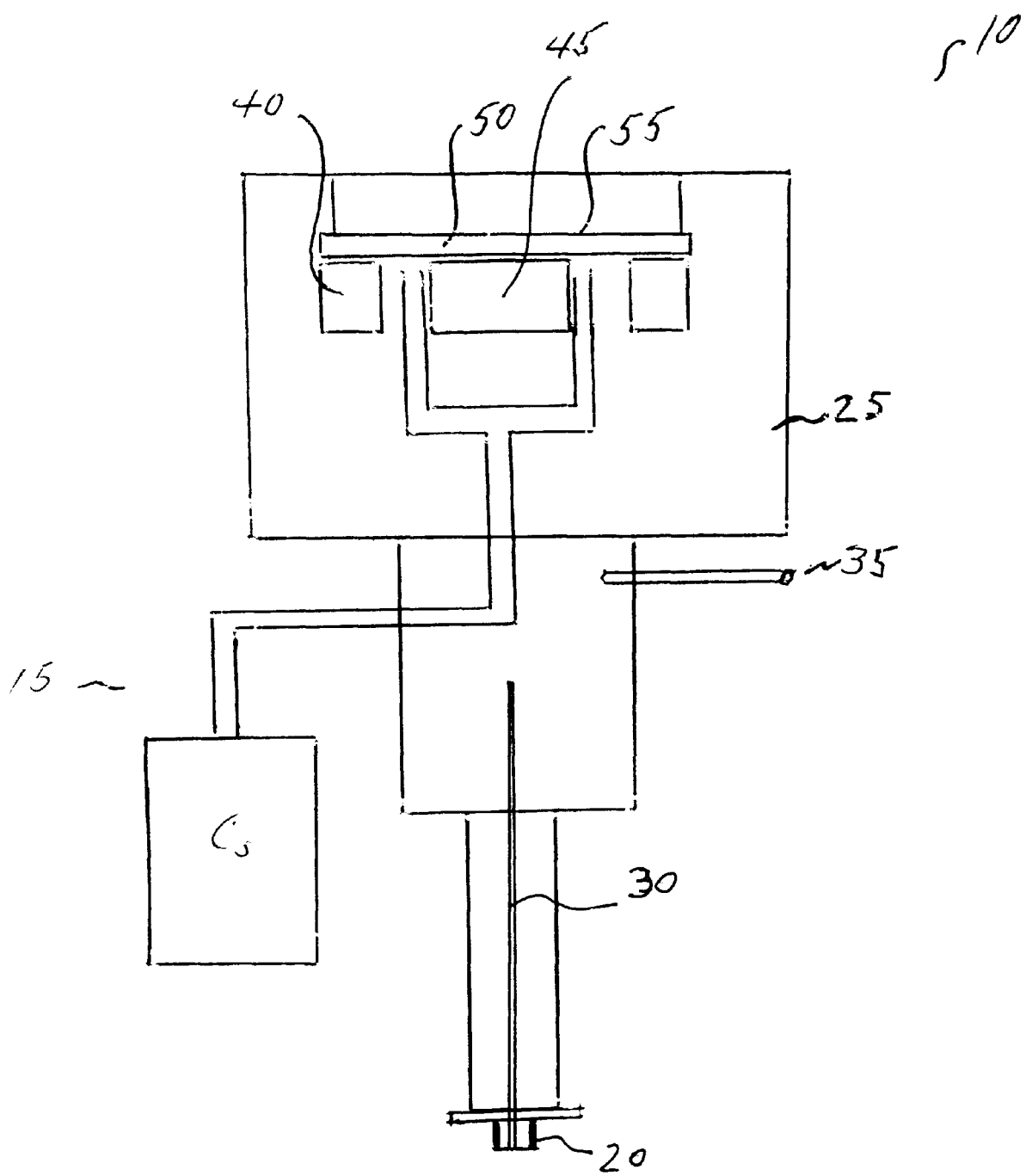
FIG. 3 shows a magnetron sputter device in accordance with the teachings of this invention.

FIG. 3 shows a magnetron sputter device 10 and a cesium introduction system 15. Power for a plasma discharge is provided through connector 20, and is conducted into the body 25 of the device by feed rod 30. Argon or another suitable gas is introduced through port 35. The plasma discharge generated by the RF power or DC power conducted by feed rod 30, ionizes the argon. The argon ions bombard the target 50 which is negatively biased with respect to the plasma potential. Magnets 40, 45 serve to confine the electrons generated by the ionization of the argon to the outer surface 55 of target 50. As a result of the argon ion bombardment, neutral sputtered particles and ions of target material are disintegrated from the target 50.

Figure 4:
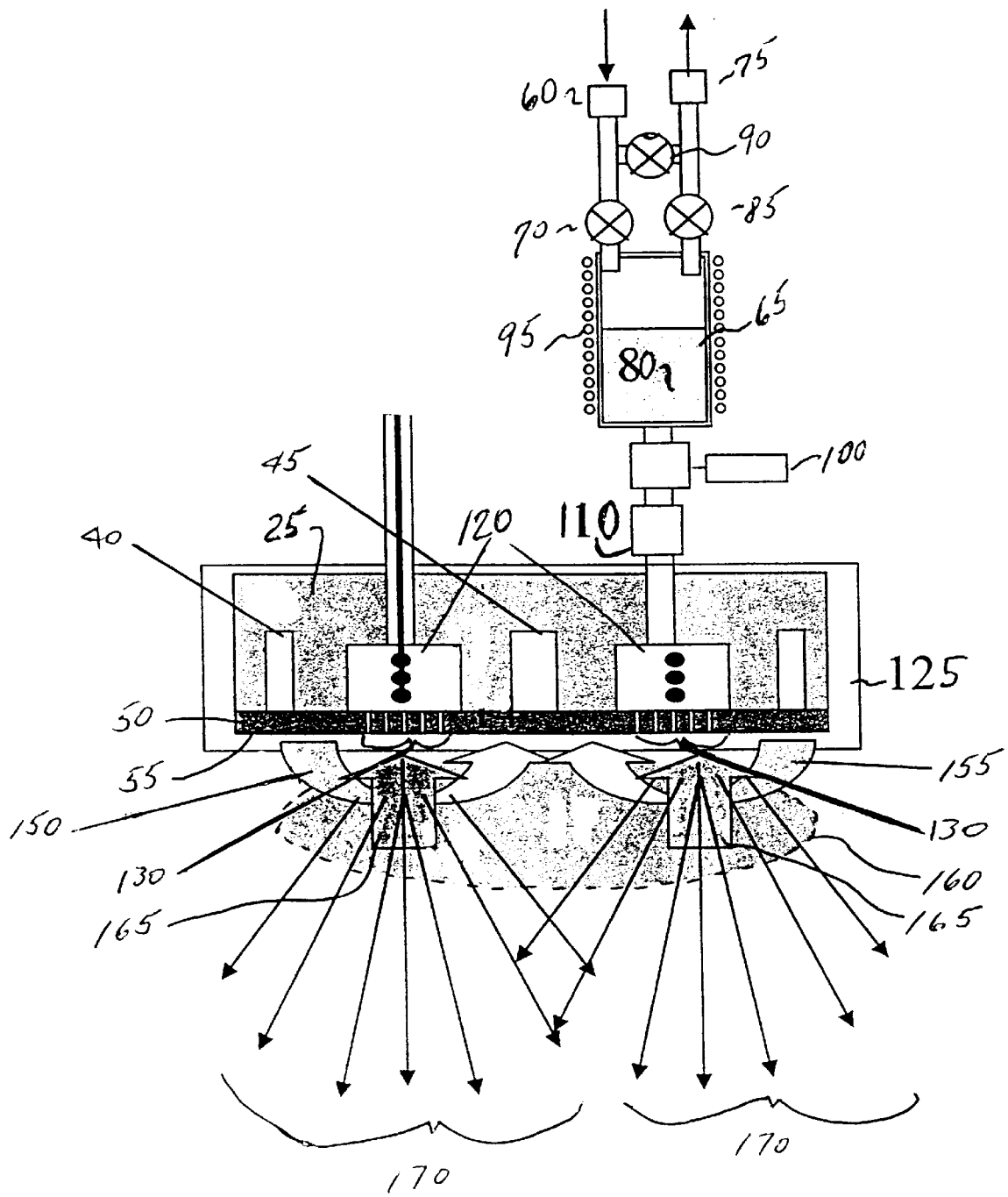
FIG. 4 shows a detailed diagram of a cesium introduction system.

FIG. 4 shows the cesium introduction system 15 and the section of the sputter device 10 holding the target 50 in greater detail. The cesium introduction system 15 includes a port 60 preferably capable of accepting a cesium ampoule. Because cesium is highly reactive with oxygen, port 60 is preferably capable of accepting a cesium ampoule without allowing the cesium to contact the atmosphere. Cesium is conveyed to a reservoir 65 through shut off valve 70, located between port 60 and reservoir 65. An additional port 75 is provided to allow the cesium reservoir 65 to be evacuated in order to maintain the confined cesium atoms (shown generally as 80) in an oxygen free environment. Valves 85 and 90 facilitate controlling evacuation and cesium flow. The cesium 80 is maintained in a liquid state in reservoir 65. A heater 95 enables heating of the reservoir 65 in order to make the cesium 80 transportable. A metering valve 100 controls the amount of cesium 80 flowing into a distribution chamber 120. An insulator 110 provides electrical and temporal insulation between the heated cesium 80 and the ground potential cesium in the distribution chamber 120.

The cesium distribution system is operated by first coupling a sealed ampoule, containing cesium, to the port 60. Valves 70 and 85 are closed, valve 90 is opened and the cesium line is evacuated, or pumped down. Once pumping down is complete, valve 90 is closed and the seal on the cesium ampoule is broken. Valve 85 is then opened and the reservoir 65 is pumped down. When pump down of the reservoir 65 is complete, valve 70 is opened, allowing the cesium to flow into the reservoir 65. Heater 95 is enabled and adjusted to control the temperature of the cesium 80 in the reservoir 65. Metering valve 100 is used to control the amount of cesium being fed to the distribution chamber 120.

The cesium distribution chamber 120 is enclosed by the sputter body 25 which is preferably constructed of copper. The sputter body 25 is further enclosed by outer shield 125 which provides a ground potential shield for the sputtering device 10. The cesium present in the distribution chamber 120 diffuses through a series of holes 130 in target 50 and is thus conveyed to the outer surface 55 of the target 50. As stated above, cesium is highly reactive with oxygen and, as such, is easily contaminated. Feeding cesium to the target from an inner surface, that is a surface inside the body 25 of the sputter device, is advantageous in that the cesium has less exposure to the environment and is less likely to be contaminated.

It should be understood that the sputtering device 10 may be comprised of a conventional magnetron sputter source, that has been retrofitted to include the cesium distribution system 15, and other components that may be suitable for ion deposition. One representative, but not limiting, example of such a conventional magnetron sputter source is Model US' Gun II™, part number SU-501-H/V, manufactured by US Inc. The cesium distribution system 15 may be retrofitted by coupling it to the conventional magnetron sputter source in a manner such that the cesium is fed into the distribution chamber 120 to be conveyed to the outer surface 55 of the target 50.

Figure 5:
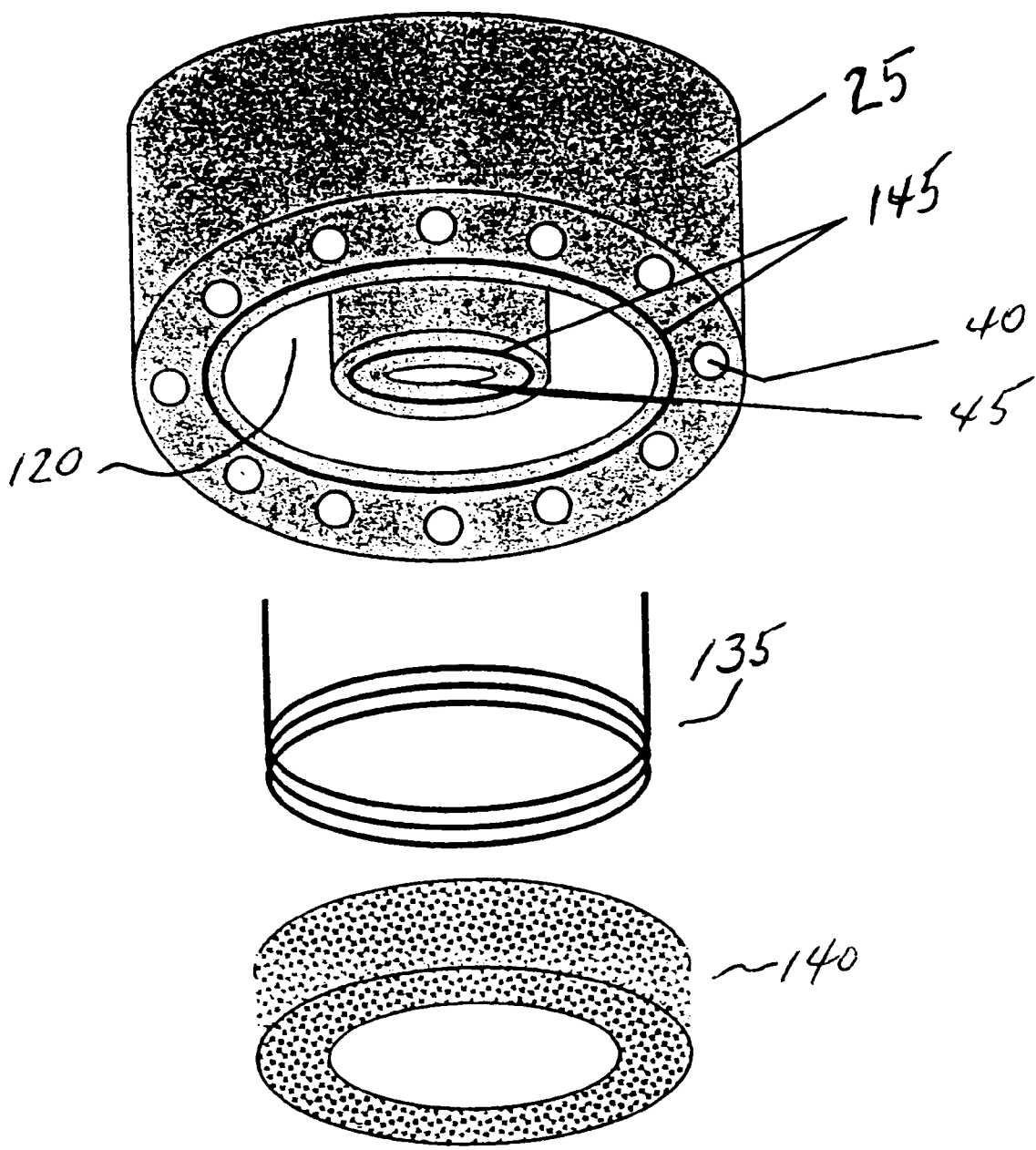
FIG. 5 shows a detailed diagram of a cesium distribution chamber.

A more detailed view of the structure of the distribution chamber shown in exploded form is represented in FIG. 5. As mentioned above, the sputter body 25 encloses the distribution chamber 120. A heater 135 heats the distribution chamber to make the cesium uniformly transportable, that is to bring the cesium to a uniform temperature and to allow the cesium to be uniformly distributed throughout the distribution chamber. An optional porous insert 140 may fill the distribution chamber 120 and may be used to further enhance the uniform distribution of cesium throughout the distribution chamber 120. The porous insert is preferably constructed of a porous metal foam, steel wool, or a cesium Zeolite™ solid electrolyte. Magnets 40 and 45 are preferably mounted in the sputter body 25. Gaskets 145 seal the distribution chamber 120 to prevent cesium leakage.

Figure 6A:
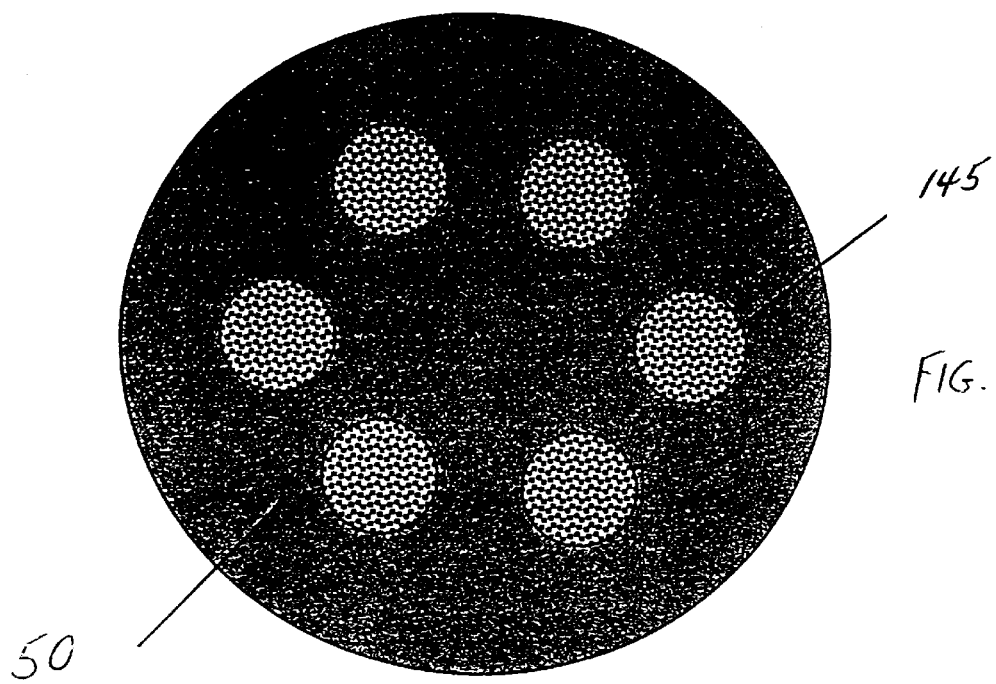
FIGS. 6A, 6B, and 6C show a top, side and bottom view, respectively, of a sputtering target.
Figure 6B:
Figure 6C:
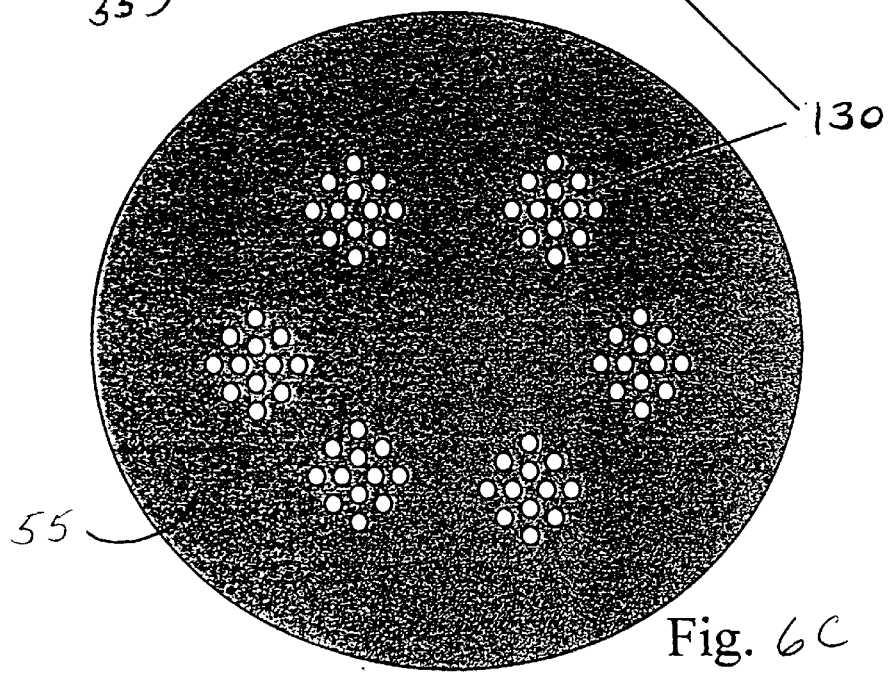

FIGS. 6A, 6B, and 6C show a top, side and bottom view, respectively, of the target 50 in greater detail. In FIG. 6A, optional plugs 145 may be mounted in target 50. The plugs are preferably porous and may be used, when required, to prevent liquid cesium from contacting the target 50. The plugs 145 may be made of Zeolite™ material or other material suitable for preventing droplets of liquid cesium from spilling onto the target 50. Holes 130 in target 50 allow the cesium to diffuse to the outer surface 55 of the target 50. The holes 130 are preferably 0.4 mm in diameter, but may range from 0.1–1.0 mm in diameter. In a preferred embodiment 8–16 holes may be grouped together in a circular pattern, which is repeated in a manner so as to correspond with the electron path defined by the magnetic field 150, 155 (FIG. 4). In another embodiment 8–16 holes may be equally distributed in a radial pattern, in a manner so as to correspond with the electron path defined by the magnetic field 150, 155 (FIG. 4). It should be understood that the invention is not limited to a particular hole size, a particular number of holes, or a particular distribution pattern of holes in the target, but may include any number of holes, hole size, or distribution pattern suitable for distributing the cesium in a uniform fashion, without compromising the structural integrity of the target 50.

Returning now to FIG. 4, magnets 40 and 45 generate a magnetic field 150, 155 which confines the electrons generated by the ionization process to a path on the outer surface 55 of target 50 corresponding to the shape (i.e. circular) of the distribution chamber 120. The plasma discharge 160 includes the electrons, argon ions and argon neutrals. Argon ions are accelerated toward the target 50 due to the target being held at a negative potential relative to the plasma. The action of the argon ions is shown by arrows 165. As a result of the argon ions bombarding the target, electrons, neutral sputtered particles, and sputtered negative ions are ejected from the target, as shown by arrows 170. Experimental results show that the invention is capable of producing a uniform sputter coating over a six inch diameter wafer. An amorphous diamond like coating has been deposited that has a high degree of hardness scratch resistant.

The geometry of the distribution chamber and the target is not limited to a circular configuration. Other geometry, such as square, rectangular, or any other geometry suitable for ion deposition may be employed in the construction of the sputtering device 10, the distribution chamber 120, the magnets 40 and 45, and the target 50. Reference in this regard may be had to Ohring, "The Materials Science of Thin Films," pp. 124–126 (Academic Press, 1992).

Figure 7:
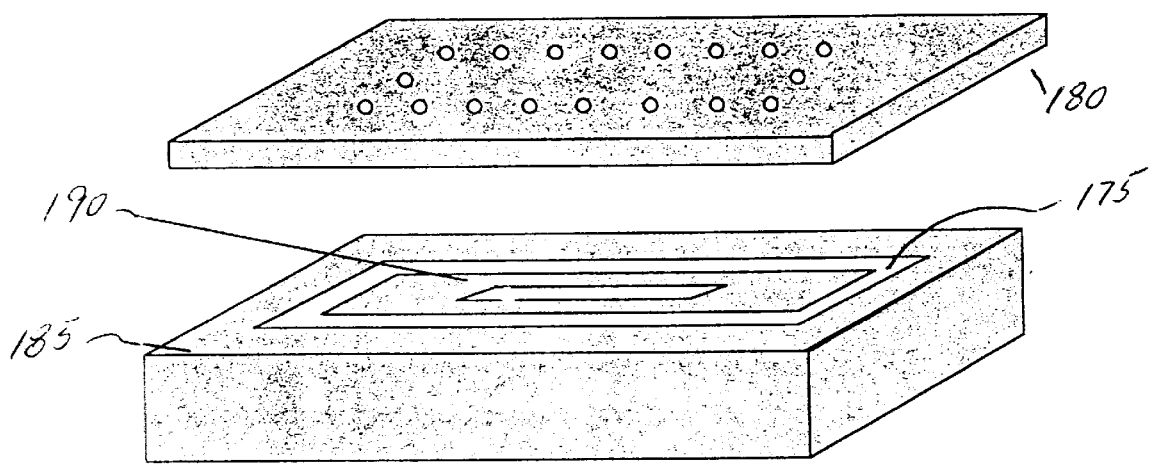
FIG. 7 shows a distribution chamber and a target having a rectangular geometry.

FIG. 7 shows a distribution chamber 175 and a target 180 having a rectangular shape. Magnets 185 and 190 are rectangular and as such, generate a rectangular magnetic field. This causes the electrons to be confined to a rectangular path on the surface of the target 180 corresponding to the rectangular shape of the distribution chamber 175.

It should be understood that while the target 50 has been described as having a series of openings which allow cesium to diffuse to the outer surface 55 of the target 50, the invention is not limited to this application of cesium to the target 50. Cesium may be introduced to the target utilizing a number of methods and techniques, from any angle, or to any surface of the target.

Figure 8:
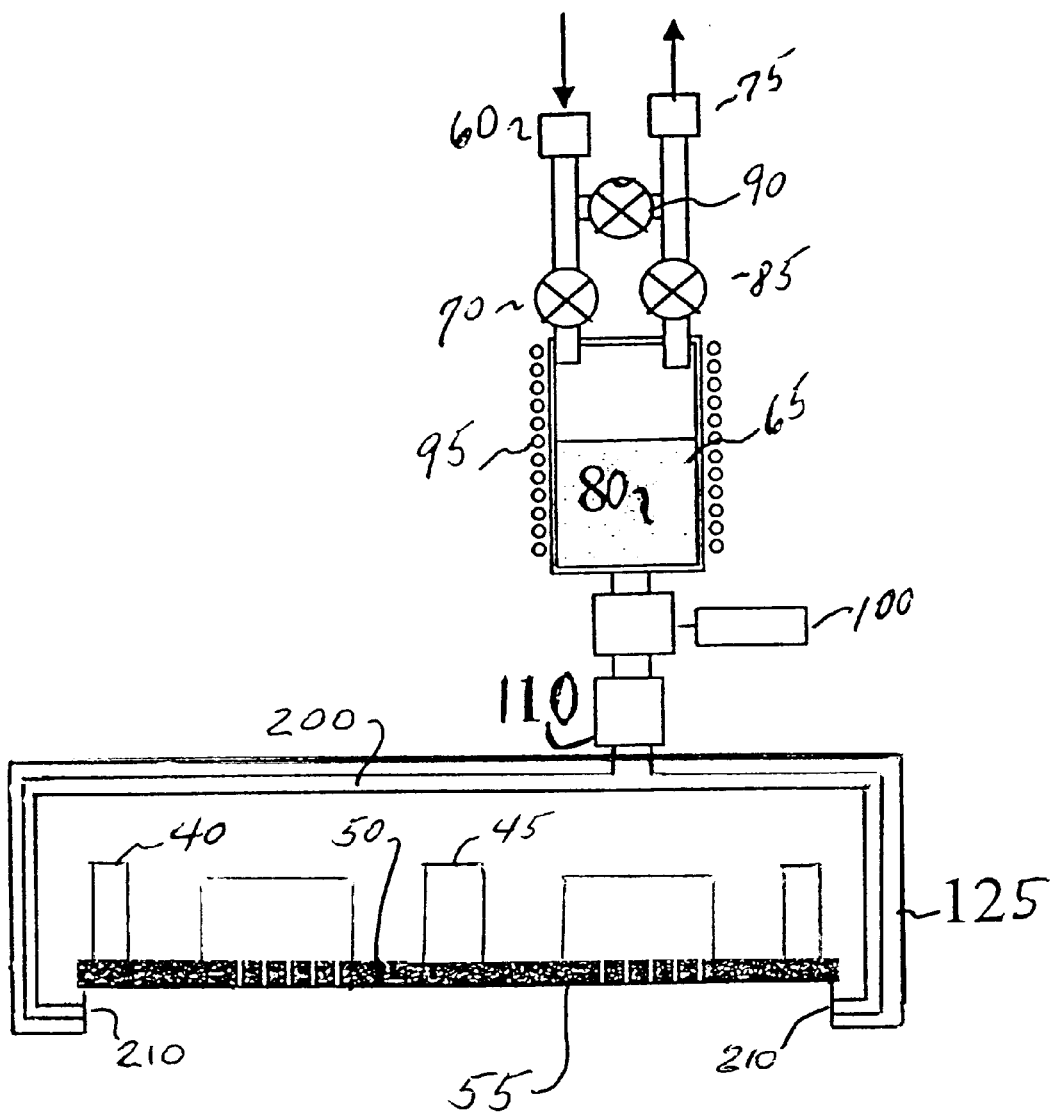
FIG. 8 shows a simplified diagram of a magnetron negative ion sputter source where cesium is delivered to an outer surface of a target.

FIG. 8 shows a simplified diagram of a magnetron negative ion sputter source where cesium is delivered to the outer surface 55 of the target 50. In FIG. 8, metering valve 110 is coupled to a channel or pathway 200 which extends through the sputter body 125. The pathway has exit ports 210 that introduce cesium to the outer surface 55 of the target 50, on which the electrons are confined by the magnetic field from magnets 40 and 45.

It should also be understood that while argon is typically utilized as the sputtering gas, the invention is not limited to the use of argon gas and that any suitable sputtering gas, for example Xenon, may be utilized in the practice of this invention.

It should further be understood that while the invention has been described in the context of an RF electrical source for generating a discharge that the invention may also be practiced using a direct current source, or any source of electrical energy suitable for producing a discharge for ion generation.

Thus, while the invention has been particularly shown and described with respect to preferred embodiments thereof, it will be understood by those skilled in the art that changes in form and details may be made therein without departing from the scope and spirit of the invention.

We claim:

1. A negative ion source, comprising:

an electrode;

a target having a more negative electrical potential than said electrode;

a supply of electrical energy for generating a discharge between said electrode and said target;

at least one magnet positioned so as to generate a magnetic field to confine electrons, generated as a result of said discharge, in close proximity to a first surface of said target; and a delivery system for delivering cesium to a second surface of said target, said second surface opposing said first surface, wherein said target further comprises a plurality of circular openings through which said cesium diffuses from said second surface to said first surface through a distribution chamber interposed between said delivery system and said target for uniformly distributing cesium on said second surface of said target.

2. The negative ion source of claim 1 wherein said delivery system has been retrofitted to a conventional magnetron sputter source.

3. The negative ion source of claim 1 wherein said distribution chamber further comprises a heater for bringing said cesium to a uniform temperature allowing said cesium to be uniformly distributed in said distribution chamber.

4. The negative ion source of claim 1 wherein said distribution chamber further comprises a porous insert disposed inside said distribution chamber for causing a uniform distribution of cesium throughout said distribution chamber.

5. The negative ion source of claim 1 wherein said delivery system further comprises:

a supply of cesium detachably coupled to a first port;

a reservoir coupled to said first port, said first port for conveying cesium to said reservoir;

a heater in close proximity to said reservoir for heating cesium in said reservoir;

a second port coupled to said reservoir for allowing said reservoir to be subject to a vacuum; and a valve for metering a flow of cesium from said reservoir to said distribution chamber.

6. The negative ion source of claim 1 wherein said supply of electrical energy supplies RF energy.

7. The negative ion source of claim 1 wherein said supply of electrical energy supplies direct current.

8. The negative ion source of claim 1 wherein the shape of said distribution chamber, said target, and said magnetic field is non circular.

9. A method of depositing ion on a substrate, comprising the steps:

generating a discharge between an electrode and a target;

confining electrons, generated as a result of said discharge, to a first area in close proximity to a first surface of said target;

delivering cesium to a second surface of said target through a distribution chamber for uniformly distributing cesium on said second surface; and diffusing said cesium through a plurality of circular openings in said target from said second surface to said first surface.

10. The method of claim 9, wherein said step of delivering further comprises the step of heating said cesium to a uniform temperature allowing said cesium to be uniformly distributed in said distribution chamber.

11. The method of claim 9, wherein said step of delivering cesium through a distribution chamber further comprises a porous insert disposed inside said distribution chamber for causing a uniform distribution of cesium throughout said distribution chamber.

* * * * *